United States Patent
Hansen et al.

[11] Patent Number: 6,054,653
[45] Date of Patent: Apr. 25, 2000

[54] APPARATUS FOR ATTACHING A SURFACE MOUNT COMPONENT

[76] Inventors: Gregory Robert Hansen, 602 Silbury Ct., McHenry, Ill. 60050; Scott William Matuszewski, 475 N. Country Ridge, Lake Zurich, Ill. 60047

[21] Appl. No.: 09/014,786

[22] Filed: Jan. 28, 1998

[51] Int. Cl.$^7$ ...................................................... H01R 9/09
[52] U.S. Cl. .......................... 174/261; 361/760; 361/777; 257/692; 228/180.22; 439/83
[58] Field of Search ..................... 174/250, 260, 174/261; 361/760, 767, 774, 777, 782, 783, 768; 257/692, 773, 786; 228/180.22; 439/83

[56] References Cited

U.S. PATENT DOCUMENTS

| | | | |
|---|---|---|---|
| 4,130,722 | 12/1978 | Levijoki | 174/261 |
| 4,509,096 | 4/1985 | Baldwin et al. | 361/719 |
| 4,870,225 | 9/1989 | Anao et al. | 174/261 |
| 5,303,122 | 4/1994 | Adams, Jr. et al. | |
| 5,311,405 | 5/1994 | Tribbey et al. | |
| 5,381,307 | 1/1995 | Hertz et al. | 361/767 |
| 5,406,458 | 4/1995 | Schutt | |
| 5,436,412 | 7/1995 | Ahmad et al. | 174/265 |
| 5,453,581 | 9/1995 | Liebman et al. | |
| 5,790,386 | 8/1998 | Magee | 361/777 |
| 5,825,628 | 10/1998 | Garbelli et al. | 361/763 |

FOREIGN PATENT DOCUMENTS

| | | | |
|---|---|---|---|
| 354148476 | 11/1979 | Japan | 257/773 |
| 405218612 | 8/1993 | Japan | 361/760 |
| 406061604 | 3/1994 | Japan | 361/760 |

OTHER PUBLICATIONS

Technical Information: Solder Pad Geometry Studies For Surface Mount Of Chip Capacitors by Kent Wicker and John Maxwell, AVX Corporation, Corporate Research Laboratory, Myrtle Beach, SC 29577. 7 pgs. Presented at 1985 ECC.

Soldering, Assembly, vol. Jul./1990, pp. 173–182.

Preventing The Manhattan Effect: Certain dimensional relationships between solder lands and component metallizations must be observed to prevent the Manhattan Effect by Y. Anbe and T. Takahashi, Tamura Corporation, Tokyo, Japan. Electronic Packaging & Production, pp. 118–120, Feb. 1991.

*Primary Examiner*—Kristine Kincaid
*Assistant Examiner*—Dhiru R Patel
*Attorney, Agent, or Firm*—Mark D. Patrick

[57] ABSTRACT

An apparatus (100) for attaching a surface mount component (102) includes a substrate (104) and a pad (106) carried on the substrate (104) to accommodate attachment of the surface mount component (102). The pad (106) has a central portion (108) and at least two triangular portions (109 and 110) separated by the central portion (108).

13 Claims, 1 Drawing Sheet

6,054,653

APPARATUS FOR ATTACHING A SURFACE MOUNT COMPONENT

FIELD OF THE INVENTION

The present invention relates generally to surface mount components, and more particularly to an apparatus for attaching surface mount components to a substrate.

BACKGROUND OF THE INVENTION

Traditionally, surface mount components, particularly those that are oddly shaped (e.g., shield clips, antenna clips, battery clips, and vibrator brackets), were attached via solder to a single rectangular pad disposed on the substrate. Unfortunately, when the solder was melted to attach the surface mount component to the pad, the surface mount component tended to move or float under the surface tension of the liquid solder and become misaligned. Attempts to reduce the rectangular dimensions of the pad to prevent floating resulted in unreliable, weak solder interconnections. Therefore, what is needed is an improved apparatus that ensures strong, reliable attachment and proper alignment of surface mount components.

DETAILED DESCRIPTION OF THE PREFERRED EMBODIMENTS

Attachment of a surface mount component is accomplished by an apparatus that includes a substrate and a single pad carried on the substrate. The pad has a geometry that accommodates attachment of the surface mount component. The pad has a central portion for underlying the surface mount component and at least two triangular portions separated by the central portion. The central and triangular portions ensure proper alignment of the surface mount component. The triangular portions ensure that the surface mount component is attached via a strong mechanical bond.

Figure 1:
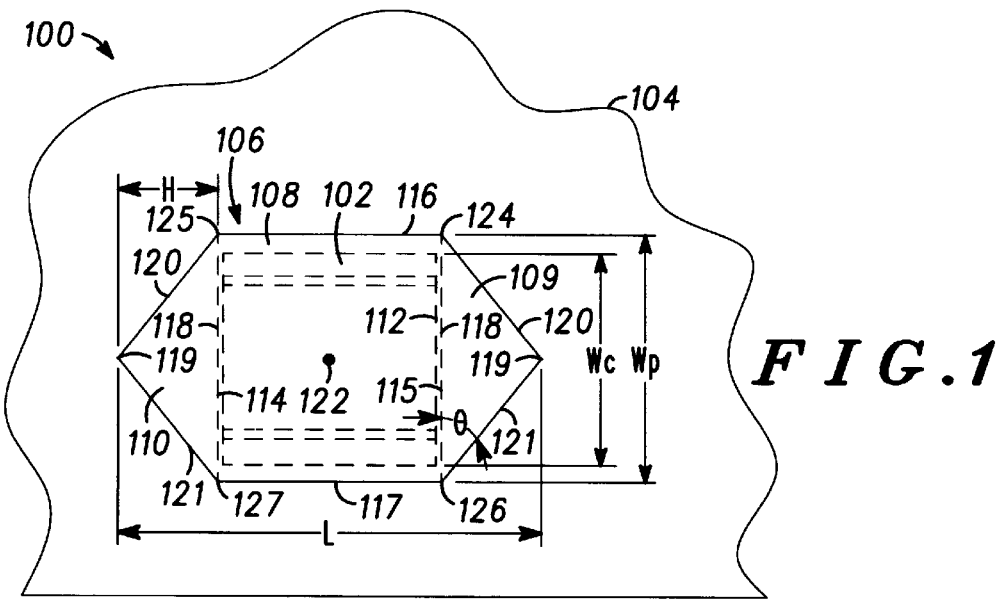
FIG. 1 is a top plan view of an apparatus for attaching a surface mount component with the surface mount component positioned thereon.

FIG. 1 illustrates an apparatus 100 for attaching a surface mount component 102, particularly an oddly shaped component such as the clip or bracket shown. The apparatus 100 includes a substrate 104, such as a printed circuit board, and a pad 106 carried on the substrate 104. The pad 106 functions to accommodate attachment of the surface mount component 102 and is fabricated from gold plated beryllium copper or other suitable conductive material. The pad 106 has a geometry that is hexagonal and is made up of integral central and triangular portions 108, 109 and 110. The central portion 108 of FIG. 1 is rectangular and dimensioned to be slightly larger than a rectangular attachment surface 112 of the surface mount component 102. The central portion 108 is bounded by opposing sides 114 and 115 and opposing sides 116 and 117. Each of the triangular portions 109 and 110 is bounded by a base 118, a vertex 119 opposite the base 118, and opposing tapering sides 120 and 121 extending between respective ends of the base 118 and the vertex 119. Each of the triangular portions 109 and 110 is equidistant from a center 122 of the central portion 108. The base 118 of the triangular portions 109 and 110 conjoin opposing sides 114 and 115, respectively, of the central portion 108. The tapering sides 120 of the triangular portions 109 and 110 intersect with ends of side 116 of the central portion 108 at junction points 124 and 125, and the tapering sides 121 of the triangular portions 109 and 110 intersect with ends of side 117 of the central portion 108 at junction points 126 and 127.

Figure 2:
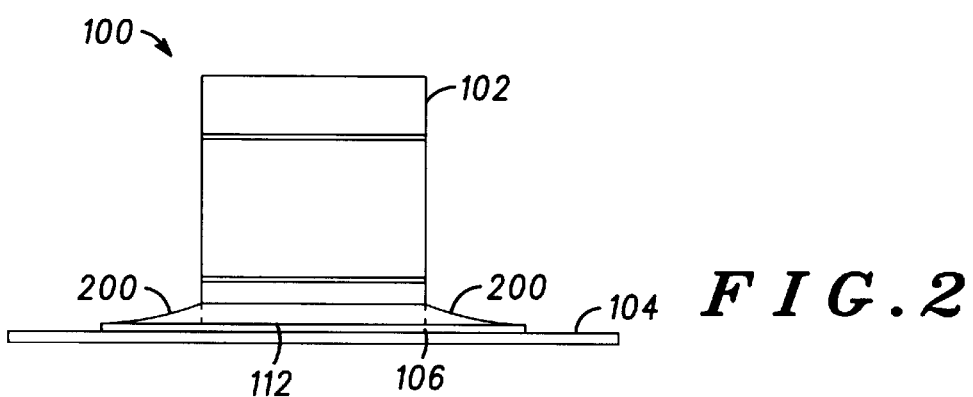
FIG. 2 is a side elevational view of the apparatus of FIG. 1 after attachment of the surface mount component.

The surface mount component 102 is attached to the pad 106 preferably via a known automated process employing known automated equipment. An empty one of the substrate 104 is loaded into a screen printer, which deposits a predetermined volume of solder paste, such as 1 $mm^3$ of tin-lead-silver alloy solder paste, on the pad 106. A part placement machine places the attachment surface 112 of the surface mount component 102 in contact with the solder paste overlying the pad 106 and in proper alignment with the central portion 108. The substrate 104 is reflow heated to a temperature sufficient to melt the solder paste to a liquidus state. The liquid solder, under surface tension, wicks up and adheres to the sides and edges of the surface mount component 102. Upon cooling, a solder joint, which is illustrated in FIG. 2 as a solder fillet 200, is formed. The solder fillet 200 defines a metallurgical interconnection between the pad 106 and the surface mount component 102.

During reflow heating, the geometry of the pad 106 prevents the surface mount component 102 from floating on the liquid solder and becoming misaligned. The surface mount component 102 is biased in alignment with the central portion 108 of FIG. 1 at the junction points 124–127 where the central and triangular portion 108–110 intersect. This biasing is due to a critical angle θ between the tapering sides 120 and 121 of the triangular portions 109 and 110 and the opposing sides 114 and 115 of the central portion 108. To ensure that such biasing occurs, the pad 106 is fabricated so that a width Wp of the central portion 108 is about 15 percent larger than a width Wc of the surface mount component 102 and a height H of each of the triangular portions 109 and 110 is about one-half of the width Wc of the surface mount component 102 (or is about 42.5 percent of the width Wp). In the embodiment illustrated in FIG. 1, the width Wc is about 2.16 mm, the width Wp is about 2.54 mm, the height H is about 1.08, the critical angle θ is about 45 degrees, and a length L of the pad 106 along its longitudinal axis is about 4.27.

The geometry of the pad 106 ensures formation of a strong mechanical bond between the pad 106 and the surface mount component 102. The strong mechanical bond results from dimensioning the pad 106 so that the height H of each of the triangular portions 109 and 110 is about one-half of the width Wc of the surface mount component 102. This results in the solder fillet 200 of FIG. 2 having a maximum collective cross-sectional length (i.e, the collective distance from vertex-to-base of portions 109 and 110) that is approximately equal to the width Wc of the surface mount component 102. The large cross-sectional length of the solder fillet 200 promotes distribution of stresses and minimizes potential mechanical failure of the interconnection.

Figure 3:
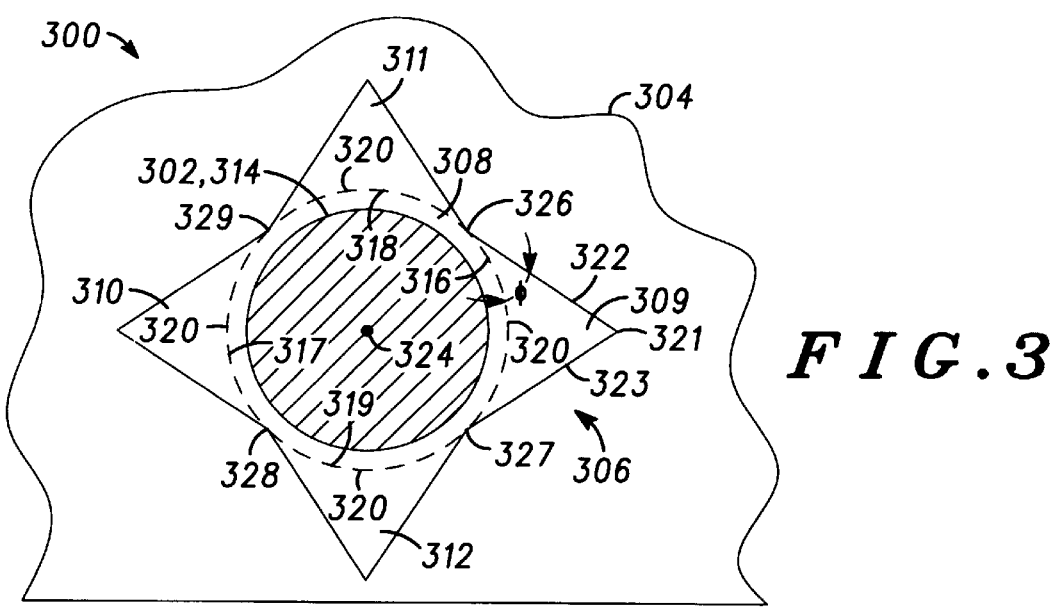
FIG. 3 is a top plan view of an alternate apparatus for attaching an alternate surface mount component with the alternate surface mount component positioned thereon.

FIG. 3 illustrates an alternate apparatus 300 for attaching an alternate surface mount component 302. The alternate apparatus 300 provides the same reliable alignment and attachment advantages as the apparatus 100 of FIGS. 1 and 2. The alternate apparatus 300 includes a substrate 304, similar to substrate 104 of FIG. 1, and a pad 306 for accommodating attachment of the alternate surface mount component 302. The pad 306 is similar in composition to pad 106, but different in geometry. The pad 306 is starshaped and is made of integral central and triangular portions 308, 309, 310, 311, and 312. The central portion 308 is circular and dimensioned to be about 15 percent larger in diameter than a circular attachment surface 314 of the alternate surface mount component 302. The central portion 308 is bounded by opposing sides 316 and 317 and opposing sides 318 and 319, which are more correctly described as four linked arcs. Each of the triangular portions 309–312 is bounded by a curved base 320, a vertex 321 opposite the base 320, and opposing tapering sides 322 and 323 extending between respective ends of the base 320 and the vertex 321. The distance between the vertex 321 and the midpoint of the base 320 is about one-half the diameter of the alternate surface mount component 302. Each of the triangular portions 309–312 is equidistant from a center 324 of the central portion 308. The base 320 of the triangular portions 309–312 conjoin sides 316–319, respectively, of the central portion 308. The tapering sides 322 and 323 of the triangular portions 309–312 intersect with the tapering sides 323 and 322 of neighboring ones of the triangular portions 309–312, respectively, at junction points 326, 327, 328, and 329 to form a critical angle θ of about 14 degrees between the tapering sides 322 and 323 and the sides 316–319.

While particular embodiments have been shown and described, modifications may be made. For example, surface mount components having attachment surfaces with geometries other than rectangular or circular, such as hexagonal or curvilinear, may be accommodated by the apparatus by creating a pad geometry employing selective placement of pairs of triangular portions around an oversized central portion. It is therefore intended in the appended claims to cover all such changes and modifications which fall within the true spirit and scope of the invention.

What is claimed is:

1. A surface mount component assembly comprising:
   an oddly shaped surface mount component having a single attachment site;
   a substrate; and
   a pad carried on the substrate to receive the oddly shaped surface mount component, the pad having a central portion and at least two triangular portions separated by the central portion, the central portion sized according to the single attachment site of the oddly shaped surface mount component, and the at least two triangular portions sized to provide a fillet formation so as to reliably attach the oddly shaped surface mount component to the pad.

2. An assembly according to claim 1 wherein
   the central portion comprises at least two opposing sides, and
   each of the at least two triangular portions comprises a base and a vertex opposite the base, the base of one of the at least two triangular portions and one of the at least two opposing sides conjoined, the base of the other one of the at least two triangular portions and the other one of the at least two opposing sides conjoined.

3. An assembly according to claim 1 wherein the central portion comprises a center, each one of the at least two triangular portions equidistant from the center.

4. An assembly according to claim 1 wherein
   the central portion comprises a width, and
   each of the at least two triangular portions comprises a height, the height about 42.5 percent of the width.

5. An assembly according to claim 1 further comprising a solder fillet disposed between the pad and the oddly shaped surface mount component, the solder fillet having a maximum collective cross-sectional length that is approximately equal to a width of the oddly shaped surface mount component.

6. An assembly according to claim 1 wherein each of the at least two triangular portions comprises a height, the height about one-half of a width of the oddly shaped surface mount component.

7. An assembly according to claim 1 wherein the central portion is rectangular.

8. An assembly according to claim 1 wherein the central portion is circular.

9. An assembly according to claim 8 wherein
   the central portion comprises a first arc, a second arc linked to the first arc, a third arc linked to the second arc, and a fourth arc linked to the first and third arcs, and
   the at least two triangular portions comprise a first triangular portion, a second triangular portion, a third triangular portion, and a fourth triangular portion, each of the first, second, third and fourth triangular portions comprising a base and a vertex opposite the base, the base of the first triangular portion and the first arc conjoined, the base of the second triangular portion and the second arc conjoined, the base of the third triangular portion and the third arc conjoined, and the base of the fourth triangular portion and the fourth arc conjoined.

10. An assembly according to claim 8 wherein each of the at least two triangular portions comprises a height, the height about one-half of a diameter of the oddly shaped surface mount component.

11. An assembly according to claim 1 wherein the pad is hexagonal.

12. An assembly according to claim 1 wherein the oddly shaped surface mount component is a clip.

13. An assembly according to claim 1 wherein the oddly shaped surface mount component is a bracket.

* * * * *